(12) United States Patent
Flachowsky et al.

(10) Patent No.: US 8,647,951 B2
(45) Date of Patent: Feb. 11, 2014

(54) IMPLANTATION OF HYDROGEN TO IMPROVE GATE INSULATION LAYER-SUBSTRATE INTERFACE

(75) Inventors: Stefan Flachowsky, Dresden (DE); Ralf Illgen, Dresden (DE); Jan Hoentschel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 123 days.

(21) Appl. No.: 13/216,862

(22) Filed: Aug. 24, 2011

(65) Prior Publication Data

US 2013/0052782 A1 Feb. 28, 2013

(51) Int. Cl.
*H01L 21/38* (2006.01)
*H01L 21/336* (2006.01)

(52) U.S. Cl.
USPC ............... 438/289; 257/E21.12; 257/E21.633

(58) Field of Classification Search
USPC ............. 438/303, 289; 257/E21.12, E21.633, 257/E21.409
See application file for complete search history.

(56) References Cited

U.S. PATENT DOCUMENTS

| 6,277,718 | B1 | 8/2001 | Naganuma et al. | |
|---|---|---|---|---|
| 2002/0025622 | A1 | 2/2002 | Schrems et al. | |
| 2005/0118792 | A1* | 6/2005 | Chakravarthi et al. | 438/527 |
| 2007/0148888 | A1* | 6/2007 | Krull et al. | 438/306 |
| 2008/0122005 | A1* | 5/2008 | Horsky et al. | 257/369 |
| 2010/0148271 | A1* | 6/2010 | Lin et al. | 257/369 |
| 2011/0309439 | A1* | 12/2011 | Matsudai et al. | 257/336 |

* cited by examiner

*Primary Examiner* — William D Coleman
*Assistant Examiner* — Christine Enad
(74) *Attorney, Agent, or Firm* — Amerson Law Firm, PLLC

(57) ABSTRACT

Generally, the present disclosure is directed to various methods of making a semiconductor device by implanting hydrogen or hydrogen-containing clusters to improve the interface between a gate insulation layer and the substrate. One illustrative method disclosed herein involves forming a gate insulation layer on a substrate, forming a layer of gate electrode material above the gate insulation material and performing an ion implantation process with a material comprising hydrogen or a hydrogen-containing compound to introduce the hydrogen or hydrogen-containing compound proximate an interface between the gate insulation layer and said substrate with a concentration of the implanted hydrogen or hydrogen-containing compound being at least $1e^{10}$ ions/cm$^2$.

15 Claims, 2 Drawing Sheets

IMPLANTATION OF HYDROGEN TO IMPROVE GATE INSULATION LAYER-SUBSTRATE INTERFACE

BACKGROUND OF THE INVENTION

1. Field of the Invention

The present disclosure generally relates to the field of fabricating integrated circuits, and, more particularly, to various methods of making a semiconductor device by implanting hydrogen or hydrogen-containing clusters to improve the interface between a gate insulation layer and the substrate.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NMOS and PMOS transistors) represent one important type of circuit elements that substantially determine performance of the integrated circuits. During the fabrication of complex integrated circuits using, for instance, MOS technology, millions of transistors, e.g., NMOS transistors and/or PMOS transistors are formed on a substrate including a crystalline semiconductor layer. A field effect transistor, irrespective of whether an NMOS transistor or a PMOS transistor is considered, typically comprises so-called PN junctions that are formed by an interface of highly doped regions, referred to as drain and source regions, with a slightly doped or non-doped region, such as a channel region, disposed between the highly doped regions source/drain regions.

In a field effect transistor, the conductivity of the channel region, i.e., the drive current capability of the conductive channel, is controlled by a gate electrode that is formed adjacent to the channel region and separated therefrom by a thin gate insulation layer. The conductivity of the channel region, upon formation of a conductive channel due to the application of an appropriate control voltage to the gate electrode, depends upon, among other things, the dopant concentration, the mobility of the charge carriers and, for a given extension of the channel region in the transistor width direction, the distance between the source and drain regions, which is also referred to as the channel length of the transistor. Hence, in combination with the capability of rapidly creating a conductive channel below the insulating layer upon application of the control voltage to the gate electrode, the conductivity of the channel region substantially affects the performance of MOS transistors.

For many early device technology generations, the gate electrode structures of most transistor elements has comprised a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate electrode stacks comprising alternative materials in an effort to avoid the short-channel effects which may be associated with the use of traditional silicon-based materials in reduced channel length transistors. For example, in PMOS transistors, the channel region may be comprised of a layer of silicon germanium that is formed in the substrate. As another example, in some aggressively scaled transistor elements, which may have channel lengths of on the order of approximately 14-32 nm, gate electrode stacks comprising a so-called high-k dielectric/metal gate (HK/MG) configuration have been shown to provide significantly enhanced operational characteristics over the heretofore more commonly used silicon dioxide/polysilicon (SiO/poly) configurations.

Depending on the specific overall device requirements, several different high-k materials—i.e., materials having a dielectric constant, or k-value, of approximately 10 or greater—have been used with varying degrees of success for the gate insulation layer in a HK/MG gate electrode structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$), and the like. Furthermore, one or more non-polysilicon metal gate electrode materials—i.e., a metal gate stack—may be used in HK/MG configurations so as to control the work function of the transistor. These metal gate electrode materials may include, for example, one or more layers of titanium (Ti), titanium nitride (TiN), titanium-aluminum (TiAl), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi), and the like.

Irrespective of the material of the gate insulation layer, e.g., silicon dioxide or a high-k material, and irrespective of the materials of the underlying substrate, e.g., silicon or silicon germanium, there are always imperfection at the interface between the gate insulation layer and the substrate. Such imperfections may be caused by a variety of factors, such as, for example, mismatched crystal lattice structures, different material phases, etc. These imperfections at the interface result in open bonds, so-called dangling bonds, that act to trap charge carriers like electrons (NMOS devices) or holes (PMOS devices) as current is flowing through the device. This trapping reduces the electrical performance capability of the device as some of the charge carriers are bonded to the dangling bonds.

One effective technique that has been employed in the past to overcome the problem of dangling bonds is to anneal the device in a high pressure deuterium ($D_2$) ambient. Such a treatment tends to eliminate virtually all of the dangling bonds and typically results in significant improvement in the performance of the final device. However, there are several problems or issues that must be confronted when using such a deuterium treatment technique. For example, the deuterium treatment technique typically is a high-pressure process (e.g. a pressure of about 8 bars) and it involves the use of expensive equipment and materials. Overall, such a process is just generally difficult to deal with given the high pressures involved and, everything considered, it is a relatively expensive process.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of making a semiconductor device by implanting hydrogen or hydrogen-containing clusters to improve the interface between a gate insulation layer and the substrate. One illustrative method disclosed herein involves forming a gate insulation layer on a substrate, forming a layer of gate electrode material above the gate insulation material and performing an ion implantation process with a material comprising hydrogen or a hydrogen-containing compound to introduce the hydrogen or hydrogen-containing compound proximate an interface between the gate insulation layer and said substrate with a concentration of the implanted hydrogen or hydrogen-containing compound being at least $1e^{10}$ ions/cm².

Another illustrative method disclosed herein includes forming a gate insulation layer on a substrate, forming a layer of gate electrode material above the gate insulation material and performing an ion implantation process with a material comprising hydrogen or a hydrogen-containing compound to introduce the hydrogen or hydrogen-containing compound proximate an interface between the gate insulation layer and the substrate, wherein the ion implantation process is performed with a dose of said hydrogen or hydrogen-containing compound ranging from $1e^{14}$-$1e^{15}$ ions/cm².

BRIEF DESCRIPTION OF THE DRAWINGS

The disclosure may be understood by reference to the following description taken in conjunction with the accompanying drawings, in which like reference numerals identify like elements, and in which.

Figure 1A:
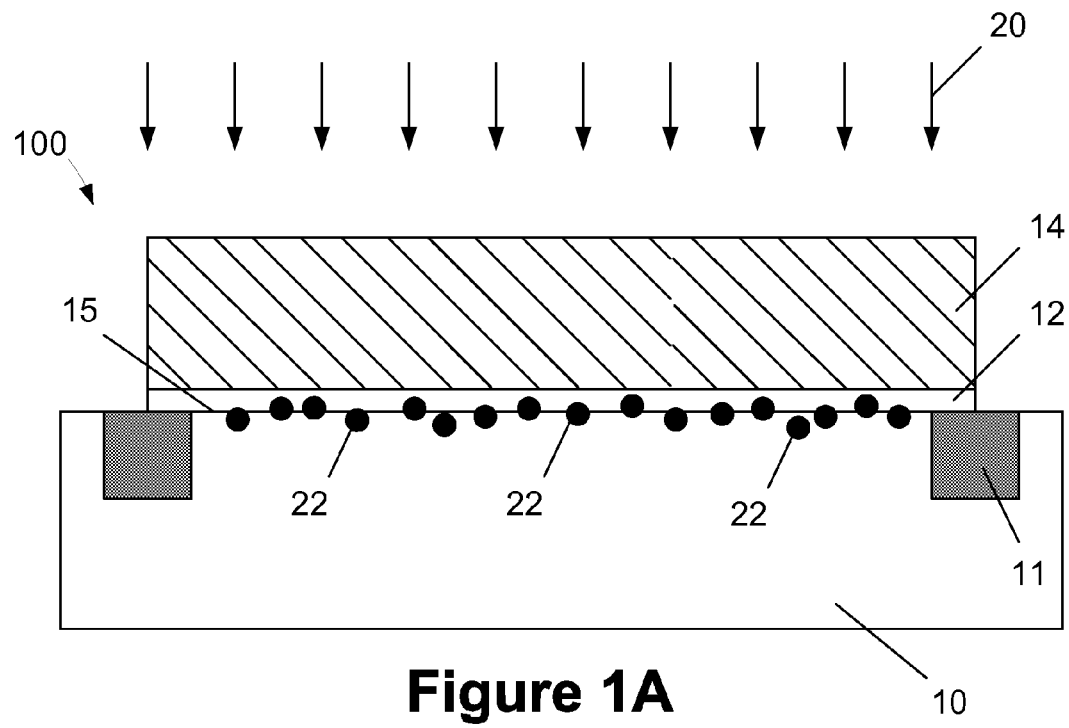
FIGS. 1A-1D depict illustrative methods that may be employed as described herein in manufacturing all or part of the illustrative semiconductor device described herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is generally related to various methods of making a semiconductor device by implanting hydrogen or hydrogen-containing clusters to improve the interface between a gate insulation layer and the substrate. As will be readily apparent to those skilled in the art upon a complete reading of the present application, the presently disclosed methods and devices are applicable to a variety of technologies, e.g., NMOS, PMOS, CMOS, etc., and they are readily applicable to a variety of devices, including, but not limited to, logic devices, memory devices, etc. With reference to FIGS. 1A-1D, various illustrative embodiments of the methods disclosed herein will now be described in more detail.

As mentioned above, the methods disclosed herein generally involve performing one or more ion implantation processes to implant hydrogen ion or hydrogen-containing compounds into a device such that hydrogen ions or hydrogen-containing compounds are positioned adjacent the gate insulation layer-substrate interface. For ease of discussion, such an ion implant process will generally be referred to as a "hydrogen implant process," but such language should not be considered as limiting the present invention to any particular species or type of hydrogen-containing material. Additionally, the term "substrate" as used herein is intended to be very broad in nature and cover any type or structure or form of a channel region of a transistor that is commonly in contact with or positioned below a gate insulation layer, such as a layer of silicon-germanium that is commonly found in PMOS devices. The term "substrate" should also be understood to cover any of a variety of different semiconductor materials, such as silicon, silicon germanium, gallium arsenide, etc.

As shown in FIG. 1A, the formation of the device 100 begins with the formation of various layers of material above a substrate 10. In the illustrative embodiment depicted herein, a layer of gate insulating material 12 and a layer of gate electrode material 14 are formed above the substrate 10. An illustrative trench isolation region 11 is also depicted as having been formed in the substrate 10. The substrate 10 may have a variety of configurations, such as the depicted bulk silicon configuration. The substrate 10 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all forms of semiconductor structures. The substrate 10 may also be made of materials other than silicon.

The various layers of material 12, 14 may be formed by performing various processes commonly used in manufacturing semiconductor devices, e.g., chemical vapor deposition (CVD), physical vapor deposition (PVD), atomic layer deposition (ALD), a thermal growth process, etc. The various layers may also be made of a variety of different materials and the thickness of each layer may vary depending upon the particular application.

In one illustrative embodiment, the layer of insulating material 12 may have a thickness of approximately 5 nm, and it may be made from any of a variety of different material, e.g., silicon dioxide, silicon oxynitride, a high-k dielectric (k value greater than 10), etc. In one particularly illustrative embodiment, the layer of insulating material 12 may be one of the following high-k dielectrics: tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$), and the like The layer of gate electrode material 14 may also be made from a variety of different materials, such as polysilicon, a silicon-based material, or a metal or metal compound, such as titanium (Ti), titanium nitride (TiN), titanium-aluminum (TiAl), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi), lanthanum, etc. In one illustrative embodiment, the layer of gate electrode material 14 may be a layer of polysilicon with a thickness of about 40-80 nm. It should also be noted that, at this stage of fabrication, it is not required that there be only the two depicted layers 12, 14. Rather, in some cases, in addition to the gate insulation layer 12, there may be multiple layers of material that will eventually comprise the gate electrode stack for a transistor device, e.g., there may be multiple layers of metal formed above the gate insulation layer 12.

As shown in FIG. 1A, the next step involves performing at least one hydrogen implant process 20 to introduce schematically depicted hydrogen ions or hydrogen-containing compounds 22 at or adjacent the interface 15 between the gate insulation layer 12 and the substrate 10 to substantially saturate the dangling bonds existing at or near the interface 15. The dose of hydrogen ions or hydrogen-containing compounds 22, the specific hydrogen ions or hydrogen-containing compounds 22 implanted and the energy level used during the hydrogen implant process 20 may vary depending upon the particular application. Depending upon the application, the hydrogen implant process 20 may be performed in a vertical orientation relative to the surface of the substrate 10 or it may be an angled implant process. The hydrogen implant process 20 may be a stand-alone process during which only hydrogen ions or hydrogen-containing compounds 22 are implanted, or the hydrogen implant process 20 may be part of other implantation process that are commonly performed in manufacturing semiconductor devices, such as a gate doping implant process, a halo-implant process, an extension implant process, a source/drain implant process, etc.

FIG. 1A depicts the illustrative example where the hydrogen implant process 20 is a blanket-type, stand-alone process, i.e., only hydrogen ions or hydrogen-containing compounds 22 are implanted during this process. A masking layer is not involved in this particular example. The dose of implanted material may range from approximately $1e^{14}$-$1e^{15}$ ion/cm$^2$ and the hydrogen implant process 20 may be performed at an energy level of approximately 0.5-5 keV.

Figure 1B:
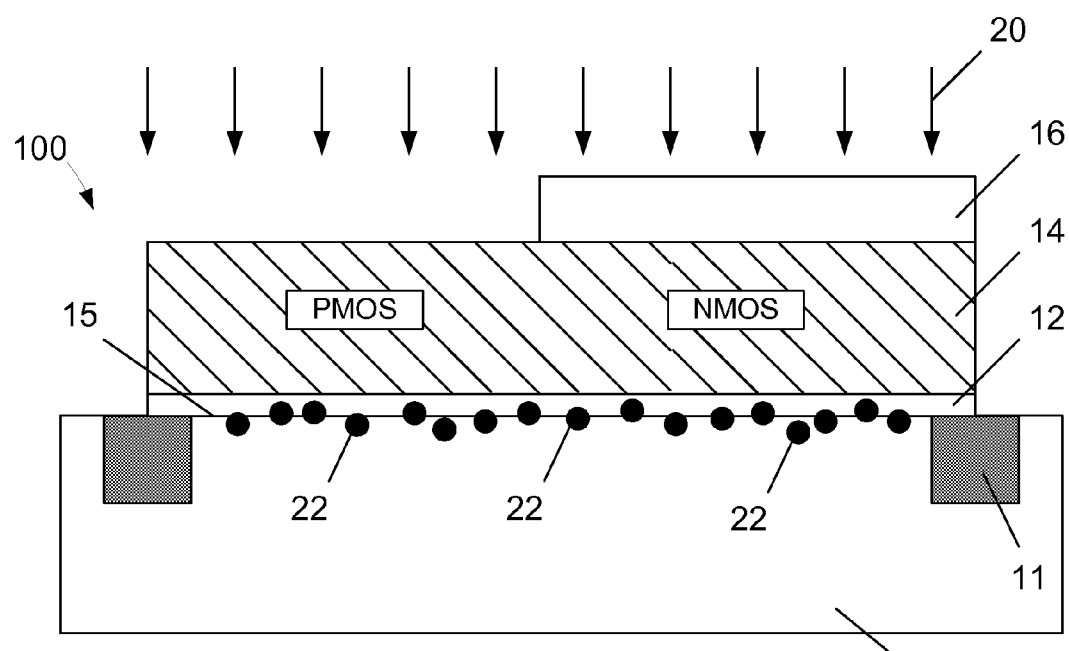
Figure 1C:
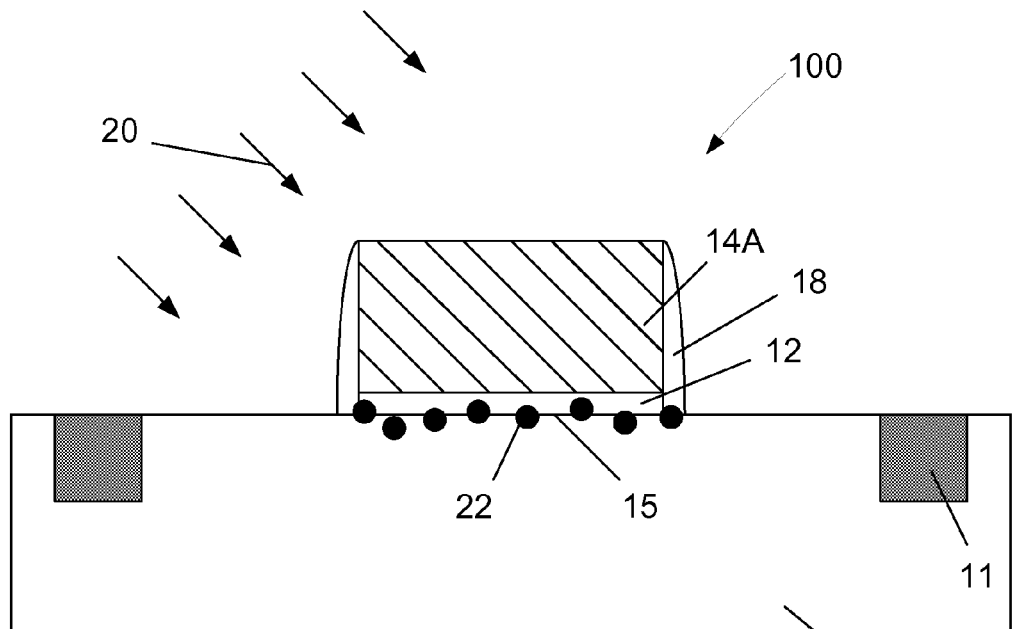

FIG. 1B depicts the illustrative example wherein a mask layer, e.g., photoresist, is formed that covers the NMOS regions of the device 100 and exposes the PMOS regions of the device 100. Of course, the situation could be reversed, i.e., the NMOS regions could be exposed and the PMOS regions could be covered. Thereafter, the hydrogen implant process 20 is a performed as part of a gate-doping implant process wherein P-type dopant materials are implanted into the layer of gate electrode material 14 so as to eventually result in a conductive gate electrode for the finished transistor device. In this example, where the transistor to be formed is an NMOS transistor, the hydrogen implant process 20 may be performed using hydrogen or an N-type dopant material that includes hydrogen, such as, $As_7H_7$ or $P_7H_7$, etc. If the transistor to be formed is a PMOS transistor, the material implanted during the hydrogen implant process 20 may be pure hydrogen or a P-type dopant material that includes hydrogen, such as, $B_{16}H_{22}$, etc. The dose of implanted material in this particular hydrogen implant process 20 may range from approximately $1e^{14}$-$5e^{15}$ ion/cm$^2$ and the hydrogen implant process 20 may be performed at an energy level of approximately 2-5 keV FIG. 1C depicts the illustrative example wherein additional process operations have been performed to define a gate electrode 14A for the device 100 and an illustrative sidewall spacer 18 has be formed adjacent the gate electrode 14A. In general, the gate electrode 14A may be formed by using traditional photolithography and etching techniques that are well known to those skilled in the art. Similarly, the spacer 18 may be formed by depositing a layer of spacer material and thereafter performing an anisotropic etching process. Of course, the spacer 18 may not be present in all applications, or there may be more than one spacer present, at the time the hydrogen implant process 20 is performed. In the illustrative example where the device 100 depicted in FIG. 1C is a PMOS transistor, the material implanted during the hydrogen implant process 20 may be part of a halo implant process and it may be performed using hydrogen or an N-type dopant material that includes hydrogen, such as, $As_7H_7$ or $P_7H_7$, etc. In another example, where the device 100 depicted in FIG. 1C is an NMOS transistor, the material implanted during the hydrogen implant process 20 may be pure hydrogen or a P-type dopant material that includes hydrogen, such as, $B_{16}H_{22}$ or $C_7H_7$ etc. The dose of implanted material in this particular hydrogen implant process 20 may range from approximately $1e^{14}$-$1e^{15}$ ion/cm$^2$ and the hydrogen implant process 20 may be performed at an energy level of approximately 0.5-2 keV.

Figure 1D:
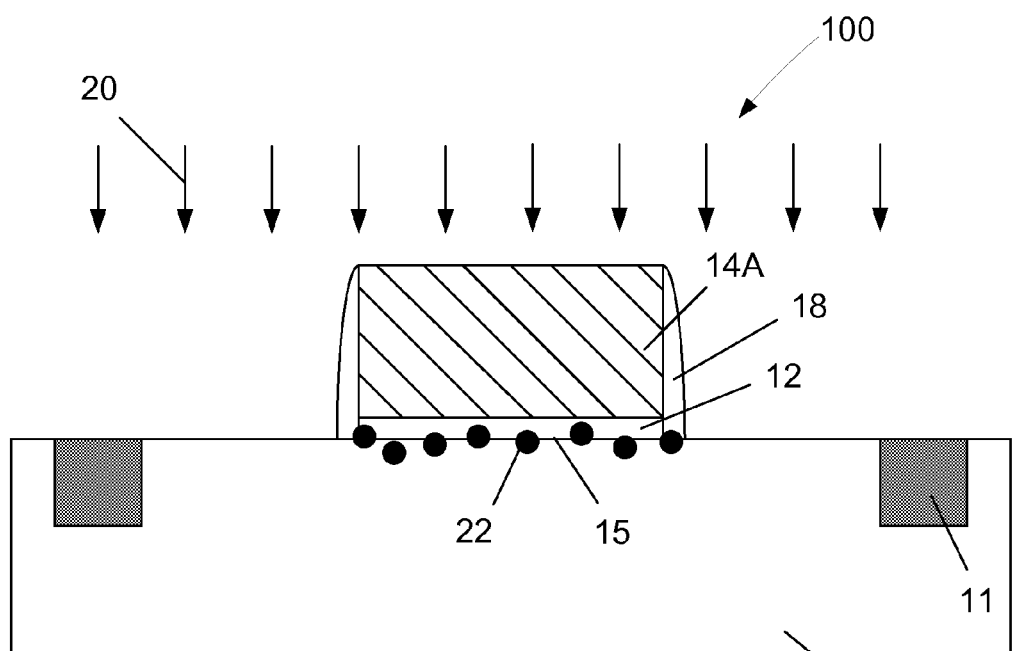

FIG. 1D depicts the illustrative example where the hydrogen implant process 20 may be performed as a stand-alone process or as part of one or more of the implantation processes that are normally performed to form source/drain regions (not shown) for the device 100, e.g., the hydrogen implant process 20 may be part of a traditional extension implant process or it may be part of the deeper source/drain implant process. In the illustrative example where the device 100 depicted in FIG. 1D is a PMOS transistor, the material implanted during the hydrogen implant process 20 may be pure hydrogen, $B_{16}H_{22}$, or $C_7H_7$, etc. In another example, where the device 100 depicted in FIG. 1D is an NMOS transistor, the material implanted during the hydrogen implant process 20 may be pure hydrogen or an N-type dopant material that includes hydrogen, such as, As7H7 or $P_7H_7$, etc. The dose of implanted material in this particular hydrogen implant process 20 may range from approximately $1e^{14}$-$1e^{15}$ ion/cm$^2$ and the hydrogen implant process 20 may be performed at an energy level of approximately 0.5-2 keV.

Of course, the dose of the hydrogen ions or hydrogen-containing compounds 22 and the energy level used during any of the above-described the hydrogen implant processes 20 may vary depending upon the particular application. In one illustrative embodiment, the conditions of the hydrogen implant process 20 should be such that hydrogen ions or hydrogen-containing compounds 22 are present at or near the interface 15 at a concentration level of about $1e^{10}$ ions/cm$^2$. By introducing the appropriate concentration of hydrogen ions or hydrogen-containing compounds 22 at or near the interface 15 the methods disclosed herein may eliminate or at least reduce one or more of the problems outlined in the background section of this application.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a gate insulation layer on a substrate;
   forming a layer of gate electrode material above said gate insulation material;
   performing an ion implantation process with a material comprising hydrogen or a hydrogen-containing compound to introduce said hydrogen or hydrogen-containing compound into an implantation region proximate an interface between said gate insulation layer and said substrate wherein a concentration of said implanted hydrogen or hydrogen-containing compound is at least $1e^{10}$ ions/cm$^2$; and
   patterning said layer of gate electrode material to define a gate electrode, wherein said implantation region comprises at least one of a portion of said gate insulation layer and a channel region of a transistor comprising said gate electrode.

2. The method of claim 1, wherein said ion implantation process is performed with a dose of said hydrogen or hydrogen-containing compound of at least $1e^{14}$ ions/cm$^2$.

3. The method of claim 1, wherein said ion implantation process is performed only using said hydrogen or hydrogen-containing compound.

4. The method of claim 1, wherein said ion implantation process is performed prior to patterning said layer of gate electrode material.

5. The method of claim 1, wherein said ion implantation process is performed after patterning said layer of gate electrode material.

6. The method of claim 5, wherein at least one sidewall spacer is formed adjacent said gate electrode prior to performing said ion implantation process.

7. The method of claim 1, wherein said ion implantation process is one of a gate doping ion implantation process, a halo implantation process, an extension implant process and a source/drain implant process and said material comprises at least one of an N-type dopant and a P-type dopant.

8. The method of claim 7, wherein said material comprises at least one of $As_7H_7$, $P_7H_7$, $B_{16}H_{22}$ or $C_7H_7$.

9. The method of claim 1, wherein said ion implantation process is performed with a masking layer positioned above said layer of gate electrode material.

10. The method of claim 1, wherein said ion implantation process is performed without a masking layer positioned above said layer of gate electrode material.

11. A method, comprising:
    forming a gate insulation layer on a substrate;
    forming a layer of gate electrode material above said gate insulation material;
    performing an ion implantation process with a material comprising hydrogen or a hydrogen-containing compound to introduce said hydrogen or hydrogen-containing compound into an implantation region proximate an interface between said gate insulation layer and said substrate, wherein said ion implantation process is performed with a dose of said hydrogen or hydrogen-containing compound ranging from $1e^{14}$-$1e^{15}$ ions/cm$^2$; and
    patterning said layer of gate electrode material to define a gate electrode, wherein said implantation region comprises at least one of a portion of said gate insulation layer and a channel region of a transistor comprising said gate electrode.

12. The method of claim 11, wherein said ion implantation process is performed only using said hydrogen or hydrogen-containing compound.

13. The method of claim 11, wherein said ion implantation process is performed prior to patterning said layer of gate electrode material.

14. The method of claim 11, wherein said ion implantation process is performed after patterning said layer of gate electrode material.

15. A method, comprising:
    forming a gate insulation layer on a substrate;
    forming a layer of gate electrode material above said gate insulation material;
    performing an ion implantation process with a material comprising hydrogen or a hydrogen-containing compound at a dopant dose of said material ranging from $1e^{14}$-$1e^{15}$ ions/cm$^2$ to introduce said hydrogen or hydrogen-containing compound into an implantation region proximate an interface between said gate insulation layer and said substrate, wherein a concentration of said implanted hydrogen or hydrogen-containing compound is at least $1e^{10}$ ions/cm$^2$; and
    patterning said layer of gate electrode material to define a gate electrode, wherein said implantation region comprises at least one of a portion of said gate insulation layer and a channel region of a transistor comprising said gate electrode and wherein said ion implantation process is one of a gate doping ion implantation process, a halo implantation process, an extension implant process and a source/drain implant process.

* * * * *